United States Patent [19]
Pucel et al.

[11] 4,060,820
[45] Nov. 29, 1977

[54] LOW NOISE READ-TYPE DIODE

[75] Inventors: Robert A. Pucel, Needham; Hermann Statz, Wayland, both of Mass.

[73] Assignee: Raytheon Company, Lexington, Mass.

[21] Appl. No.: 646,101

[22] Filed: Jan. 5, 1976

[51] Int. Cl.$^2$ .................. H01L 29/90; H01L 29/48
[52] U.S. Cl. .......................... 357/13; 357/15; 357/89; 357/90
[58] Field of Search .................. 357/13, 15, 89, 90

[56] References Cited
U.S. PATENT DOCUMENTS

3,904,449  9/1975  Di Lorenzo et al. .............. 357/13

Primary Examiner—Edward J. Wojciechowicz
Attorney, Agent, or Firm—John R. Inge; Joseph D. Pannone; Milton D. Bartlett

[57] ABSTRACT

A Read-type avalanche diode having a low noise measure and capable of attaining output signal powers of one watt or more. An effective injection current is defined as the conduction current in the avalanche zone in the absence of avalanche multiplication including therein any tunneling current. The noise measure of the diode is minimized by increasing the defined effective injection current with disclosed techniques. In one embodiment, the effective injection current is increased by the presence of traps located in the avalanche region. In another embodiment, a Schottky barrier contact having a low work function is provided. Surface states of the avalanche region are also varied to produce the desired increase. Increased effective injection current may also be produced in a device with preferred heat flow properties. The noise performance of both oscillator and amplifier circuits is improved with the invention.

20 Claims, 10 Drawing Figures

LOW NOISE READ-TYPE DIODE

BACKGROUND OF THE INVENTION

1. Field of the Invention

The invention relates to avalanche diodes of the Read-type having a diode junction, an avalanche region, and a drift region.

2. Description of the Prior Art

What are now termed Read-type diodes were first disclosed by W. T. Read, Jr. in 1958 ("A Proposed High-Frequency Negative-Resistance Diode," W. T. Read, Jr., Bell System Technical Journal, March 1958, pp. 401–446). Since the original disclosure, numerous improvements in the attainable output power and dc to output signal power conversion efficiency have been made to the point where Read-type diodes have become useful in many microwave communications applications. Unfortunately, the applications in which Read-type diodes have heretobefore been employed have been greatly limited by the noisy output signals produced by previously available devices. For although prior Read-type diodes have been capable of producing higher output powers at greater power conversion efficiencies than other types of avalanche microwave oscillator and amplifier diodes, their noise measure has been so high as to prohibit their use in many systems where noise is an important consideration. Noise meausres of 60 db or greater were commonly found with previous devices whereas noise measures of 50 db or less are required in many important communications applications.

The causes of noise in the output signals from Read-type diodes have heretofore been imperfectly understood. In considering IMPATT-type avalanche diodes, it was known that the noise measure of such devices increased with increased operating temperature and power levels. It was also known that in Read-type diodes, the noise measure could vary considerably among diodes with different doping profiles. However, no theoretical treatment has appeared leading to the production of Read-type diodes having a predictable and controllable noise measure.

SUMMARY OF THE INVENTION

Accordingly, it is an object of the present invention to provide a Read-type diode having a predictable and controllable noise measure.

It is also an object of the invention to provide a Read-type diode having a noise measure of 50 db, 40 db, or less.

Furthermore, it is an object of the invention to provide such a diode having an output power of one watt or more.

These as well as other objects of the invention may be met by providing a Read-type diode having a noise measure less than 50 db. In some embodiments, the diode produces in an amplifier or oscillator circuit an output signal having an output signal power of at least one watt upon application to the diode of a voltage of predetermined magnitude sufficient to produce charge carrier multiplication within the diode. Preferably, the diode has metal-low-high-low profile. The metal may comprise a metal which has a work function lower than the work function of platinum or lower than the work functions of either platinum or chromium. In preferred embodiments, the metal comprises tungsten.

Objects of the invention may also be met by providing a Read-type diode having a ratio of average dc current to effective injection current of less than 100. Preferably, the ratio of dc current to effective injection current is 30 or less and is preferably within the range of 30 to 10. The diode may comprise at least a Schottky barrier forming metal electrode and at least two layers of semiconductor material. The diode may have a metal-low-high-low profile. In alternative embodiments of the invention, the diode may have a metal-high-low profile in which the metal has a work function preferably less than the work functions of either platinum or chromium. The diode should be biased such as to produce in some embodiments of the invention an output signal power of one watt or more upon application to the diode of a bias voltage of sufficient magnitude to produce avalanching of charge carriers in a layer of semiconductor material which is adjacent the metal.

Also, objects of the invention may be met by providing a Read-type diode having a ratio of effective injection current to junction area of at least 30 amps/cm². The diode preferably produces a noise measure of 50 db or less. The diode may produce an output signal power of at least one watt upon application to the diode of a bias voltage of predetermined magnitude which will produce a field within the avalanche region of the diode of sufficient magnitude to produce charge carrier multiplication therein. The diode in preferred embodiments has a metal-low-high-low profile. The metal comprises a metal which preferably has a work function lower than the work function of either chromium or platinum.

Further in accordance with the invention, an amplifying circuit may be constructed which comprises a Read-type diode with a noise measure of less than 50 db having heat sinking means thermally coupled to the diode. The amount of thermal coupling between the heat sinking means and the diode may be predetermined in such a manner that the noise measure is less than 50 db. In some embodiments, the circuit may produce an output power of at least one watt. The diode may comprise a Schottky barrier forming contact adjacent a layer of semiconductor material within the diode, the semiconductor material including therein trap sites for increasing the magnitude of the effective injection current of the diode. In some embodiments of the invention, the diode has a metal-high-low profile whereas in other embodiments of the invention the diode has a metal-low-high-low profile. In either case, the metal preferably has a work function lower than the work functions of either platinum or chromium.

Moreover, objects of the invention are also satisfied by providing a Read-type diode having a metal-low-high-low profile and having a noise measure less than 50 db wherein the first low region, that low region contiguous to the metal region, comprises a plurality of trap means for the purpose of increasing the magnitude of the effective injection current of the diode over the value it would have absent the presence of the trap means. In some embodiments, the trap means comprises lattice discontinuities whereas in other embodiments of the invention the trap means comprises atoms of doping material. The doping material used for creation of the trap means may comprise a doping material other than the doping material with which the semiconductor material is doped to attain its required conductivity.

Furthermore, the invention may be practiced by providing a Read-type diode having a metal-low-high-low profile which further comprises a thin layer of oxide material between at least portions of the metal region and the low region adjacent to the metal region. The thin layer of oxide is preferably formed as an oxide of the semiconductor material.

The invention also includes a method which comprises the steps of providing a drift region of semiconductor material, providing an avalanche region termination layer upon at least a surface of the drift region, providing an avalanche region upon the avalanche region termination layer wherein the avalanche region comprises trap means, and providing a Schottky barrier forming metal contact upon at least portions of a surface of the avalanche region. The step of providing the avalanche region may comprise, in a preferred embodiment, providing the trap means by producing lattice irregularities or discontinuities within the avalanche region. The trap means may further be provided by implanting ions within the avalanche region using ion implantation techniques. The step of providing the avalanche region may further comprise the step of providing a thin layer of oxide material between at least portions of the avalanche region and the metal contact. The oxide material is preferably formed as an oxide of the semiconductor material.

The invention also encompasses a method which comprises the steps of providing a drift region of semiconductor material, providing an avalanche region termination layer upon at least a surface of the drift region, providing an avalanche region upon the avalanche region termination layer, and providing a Schottky barrier metal contact upon the avalanche region wherein the metal contact is formed from a metal which has a work function lower than the work function of either platinum or chromium. In preferred embodiments, the metal comprises tungsten.

DESCRIPTION OF THE PREFERRED EMBODIMENTS

Figure 1:
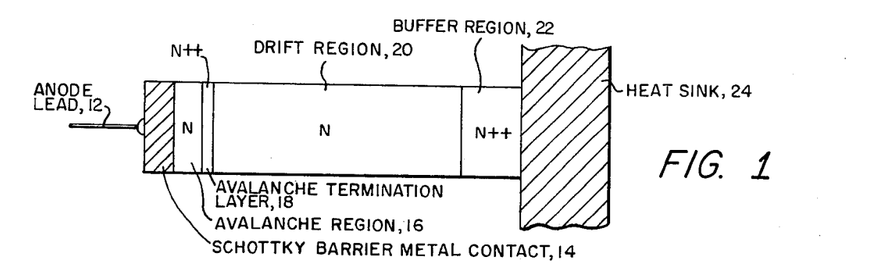
FIG. 1 is a cross-sectional view of a Read-type diode in which the present invention is used to advantage.

Referring first to FIG. 1 there is shown a cross-sectional view of a Read-type avalanche diode in which the present invention may be used to advantage. The diode profile includes a Schottky barrier junction forming metal contact 14, an avalanche region 16, an avalanche termination layer 18, a drift region 20, and one or more buffer regions 22 with a heat sink 24 thermally coupled to buffer region 22. The device operates basically upon principles disclosed in the cited publication by Read. However, the PN semiconductor junction of Read has here been replaced by a Schottky barrier junction. Also, avalanche termination layer 18 has been added to increase the efficiency of the device by confining the avalanche region to a predetermined width.

Figures 2, 3:
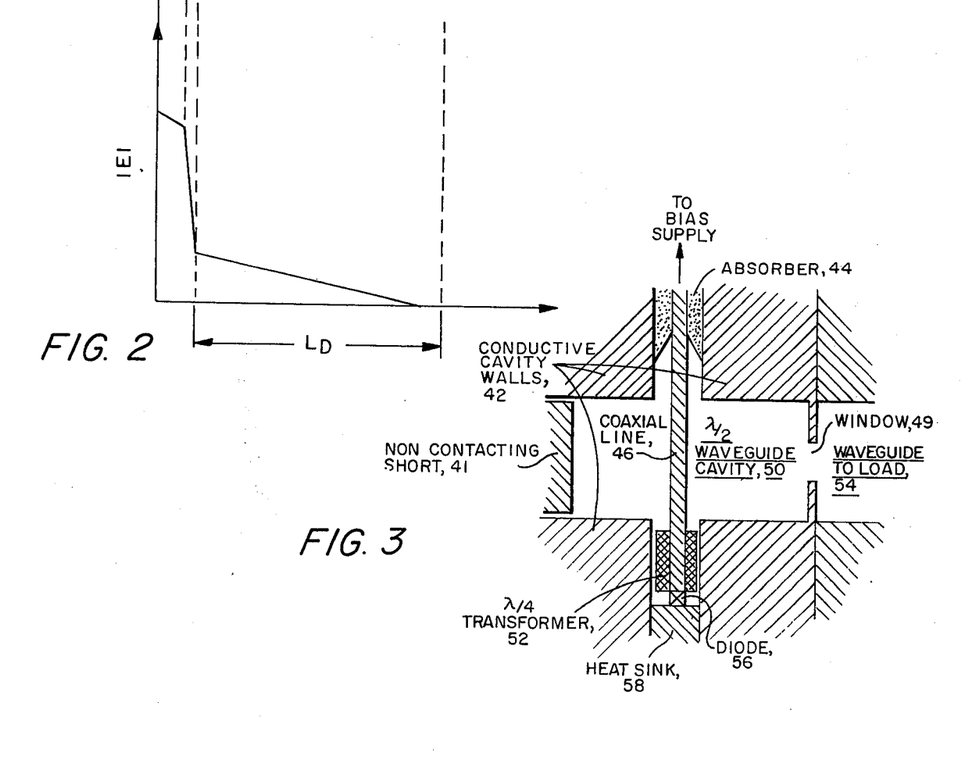
FIG. 2 is a graph of the magnitude of the electric field within the device of FIG. 1.
FIG. 3 is a cross-sectional view of an oscillator device in which diodes of the invention may be used to advantage.

In normal device operation, the diode is reverse biased with buffer region 22 at a positive potential with respect to Schottky barrier metal contact 14 thereby reverse biasing the diode junction between Schottky barrier metal contact 14 and avalanche region 16. The electric field produced across the device in response to the applied voltage is shown in FIG. 2. Avalanche region 16 is a relatively low doped region with preferred doping density in the range of $5 \times 10^{15}$ to $10^{17}/cm^3$. The electric field is at a sufficiently high level in avalanche region 16 to produce an avalanche of charge carriers by the well-known phenomenon of charge carrier multiplication during a portion of the signal cycle.

Avalanche termination layer 18, a thin layer of highly doped semiconductor material, causes the electric field to drop rapidly therein to a level below which no further avalanching can occur. The amount of drop in the electric field is dependent upon the total amount of dopant contained within avalanche termination layer 18. Avalanche termination layer 18 has a preferred doping density in the range of $2 \times 10^{17}$ to $5 \times 10^{17}/cm^3$.

Avalanched carriers produced within avalanche region 16 bunch together upon passing from avalanche region 16 through avalanche termination layer 18 to drift region 20. The presence of the bunched carriers reduces the electric field in the avalanche region 16 causing avalanching to cease during a portion of the signal cycle. The bunched carriers are pulled through drift region 20 by the electric field present therein until they reach highly doped buffer region 22 where they recombine. The transit time through drift region 20 is chosen such that the recombining carriers arrive in phase with the signal current thus making the diode effectively a negative resistance. Drift region 20 has a low doping density, preferably in the range of $3 \times 10^{15}$ to $3 \times 10^{16}/cm^3$. The length of drift region 20 determines the transit time through the diode and hence the frequency or frequency range at which the diode will operate. Heat, which is generated principally in avalanche region 16 and drift region 20, passes through buffer region 22, which is a relatively good conductor of heat because of its high doping density, to heat sink 24 through which it is dissipated. The thickness of drift region 20, buffer region 22 and the thermal properties of heat sink 24 determine the rate at which heat is removed from the diode and hence the operating temperature within avalanche region 16.

It has been discovered that the noise measure of the diode, as defined below in the Theoretical Analysis, is mainly dependent upon the magnitude of what is termed the effective injection current of the diode. The effective injection current is defined as the total conduction current through the diode not including the current by avalanching. It includes current caused by tunneling of carriers through the Schottky barrier junction.

It has further been discovered that the noise measure of the diode generally decreases with increasing effective injection current. Thus, increasing the effective injection current by any of the disclosed means results in a diode having a lower proportion of noise in its output.

The effective injection current may be increased by a number of techniques. In one embodiment of the invention, trap sites are located within the avalanche region. The trap sites provide energy levels from which a charge carrier can be released by impact ionization by another charge carrier or by the tunneling phenomena adding to the effective injection current. Traps may be produced by adding impurities to the doping avalanche region material which may be other than the dopant material also used therein. Traps may also be produced by lattice defects such as by omission of semiconductor atoms from their ordinary lattice sites. Such lattice defects may be introduced by ion implantation techniques.

In another embodiment, the effective injection current can be increased by the use of a thin layer of the oxide of the semiconductor material from which the device is formed located between the Schottky barrier contact and the avalanche region. This thin layer of oxide need have a thickness of only several oxide molecules and may be located over all or only a portion of the interface between the Schottky barrier contact and avalanche region. The presence of the thin layer of oxide provides surface states or energy levels from which charge carriers can be released to add to the effective injection current.

The effective injection current can also be increased by using for the Schottky barrier metal contact a metal having a lower work function than that of chromium and platinum which were used with previous Schottky barrier junction Read-type diodes. Tungsten is a preferred material. The lowered work function of the Schottky barrier contact makes it easier for a charge carrier to tunnel through the barrier and contribute to the effective injection current. Alloys or mixtures of Schottky barrier forming material may also be used to yield the desired work function.

The previously mentioned technique for increasing the effective injection current may be used for either diodes having a relatively low power output for use in oscillators and low power amplifiers or for diodes having a relatively high power output of one watt or more and intended for use primarily in signal amplifying and output stages. The effective injection current may also be increased by increasing the temperature of the diode junction region. The increased temperature over that at which previous devices have been operated may be accomplished by a device having a higher thermal resistance between junction and heat sinks than in previous devices. The thermal resistance can be controlled in part by controlling the thickness of the buffer region between the heat sink and drift region. A device with increased temperature can also be produced by using a heat sink having a lower thermal conductivity than was previously used. As the noise measure has been found to decrease generally monotonically with operating power level and operating temperature, the noise measure of a device may be minimized in any particular application by operating the device at a temperature as high as possible without causing device failure. If a noise measure larger than minimum can be tolerated, the operating temperature can be set at an appropriately lower level corresponding to the desired noise measure.

In still another embodiment of the invention, the effective injection current may be increased by confining the avalanche region within a narrow layer immediately adjacent the Schottky barrier contact. A moderate-to-heavily doped avalanche region is used with a preferred doping density of $10^{16}/cm^3$ or greater. No avalanche termination layer is used with this embodiment. The moderate-to-heavily doped avalanche region increases the effective injection current by providing a "thinner" Schottky barrier through which charge carriers can tunnel more easily than with an avalanche region having a lower doping density. That is, the minimum energy needed for an electron to enter the conduction band decreases at a greater rate for highly doped materials than for more moderately doped materials.

The same effect may also be achieved by using a metal-low-high-low profile as with previously described embodiments with the avalanche region confined to a narrow layer by locating the avalanche termination layer, formed from a spike of dopant, nearer the Schottky barrier forming metal contact than in previous devices.

In general, any technique which increases the probability that a charge carrier will tunnel through the energy barrier at the Schottky barrier junction will increase the effective injection current and thereby reduce the noise measure of a diode in accordance with the invention. This may be done by either reducing the height of the energy barrier such as by using for the Schottky barrier junction forming metal a metal having a comparatively low work function or by reducing the effective "thickness" of the barrier by using a more heavily doped avalanche region.

Combination of the above techniques for increasing the effective injection current and decreasing the noise may be used. For example, a device may be constructed using a Schottky barrier junction forming metal having a work function of either chromium or platinum also having a thermal resistance which will provide a preferred operating temperature.

It has been found that diodes constructed in accordance with the teachings of the invention can have a noise measure of 50 db, 40db, or less with operating powers as high as one watt or more. Another figure of merit for avalanche type diodes which relates directly to the noise performance of the diode is the effective multiplication factor. The effective multiplication factor is defined as the ratio of IDC, the average dc current through the diode, to $I_{ei}$, the effective injection current. In general, a low effective multiplication factor is indicative of low noise ouput. With the present invention, diodes may be constructed having an effective multiplication factor of 100 or even less whereas previous diodes had effective multiplication factors of much more than 100. In some diodes having low noise constructed in accordance with the teachings of the invention, the effective multiplication factor will be within the range of 10 to 30.

In FIG. 3 there is shown an oscillator device in which the present invention is used to advantage. The device is known in the art as a kurokawa circuit. A half wavelength waveguide cavity 50 is formed within conductive cavity walls 42. A non-contacting short 41 closes one end of the cavity while the output signal is extracted through the opposite cavity wall through a window 48. The output signal is coupled along waveguide 54 to a load or utilization circuit.

A diode 56, having low noise properties for having been constructed in accordance with the principles of the invention, is located within one of the conductive walls 42 atop head sink 58. In some embodiments of the invention, heat sink 58 and/or the thermal resistance between the diode or diode junction are chosen to yield a predetermined operating temperature for diode 56. A quarter-wave transformer 52 couples coaxial line 46 to diode 56. Coaxial line 46 conveys dc operating power from a bias supply as well as providing radiating means for coupling output signals from diode 56 into waveguide cavity 50. Absorber 44, formed of resistive material, blocks the passage of energy along coaxial line 46 outside of waveguide cavity 50.

Using the present invention, oscillator circuits may be constructed having a lower portion of noise in the output signal than was previously possible with previously known Read-type diode devices in many communications applications in which previous devices could not be used because of their unfavorable noise properties. The invention is of course also useful in amplifying applications such as would be used in microwave communications systems such as telephone relay equipment in which the noise current of amplified signals is of prime importance.

THEORETICAL ANALYSIS

Section I: Introduction and Assumptions.

The following assumptions are made in the analysis:
a. The ionization rates have only dc and fundamental-frequency Fourier components.
b. The phase fluctuations experience no "restoring force" and there is no amplitude-to-frequency noise conversion. These assumptions also underlie the van der Poll oscillator noise analysis.
c. In some of the calculations the simplifying assumption is made of equal ionization rates for electrons and holes, even though this is not the case for GaAs diodes.

In Section II the Read equation is reviewed in the presence of noise. In Section III the equation for the signal current is solved and the diode signal voltage is found by integration of Poisson's equation in the drift region. The primary noise current produced by avalanche multiplication is found in Section IV.

The noise current flowing through the diode short-circuited across its terminal sets up internal fields which produce a "feedback" on the avalanche zone, modifying the "primary" current caused by avalanche multiplication. The short-circuit noise current flowing out of the diode terminals, including the feedback, is determined in Section V. Section VI evaluates the noise measure of a large-signal Read diode. In Section VII theory is compared with experimental results.

Section II: Equations.

A diode model consisting of a narrow avalanche region of length L is considered in which an approximately constant dc and ac electric field are assumed, followed by a drift region of length $L_d$. In other words, a doping profile of the low-high-low kind is assumed and the contribution of the carrier space charge to the electric field in the avalanche zone is neglected.

Read[1] has devised an equation, applicable to the avalanche zone, which was later refined by Kuvas and Lee.[2] In its simplest form it is:

$$\tau_1 \frac{dI_{ca}}{dt} = I_{ca}(\alpha L_a - 1) + I_{ei} + g(t) \quad (2.1)$$

Here $\tau_1$ is the avalanche build-up time, $I_{ca}$ the conduction current in the avalanche zone, $\alpha$ the ionization coefficient, and $g(t)$ is the Langevin term describing the noise generation.

$I_{ei}$ in equation (2.1) is the value of $I_{ca}$ in the absence of avalanche multiplication. When tunneling is present, $I_{ei}$ in equation (2.1) does not saturate with voltage as the normal saturation current but is a monotonically increasing function of voltage. Under oscillating conditions $I_{ei}$ then becomes time-dependent. Nevertheless, $I_{ei}$ is treated in equation (2.1) as if it were time-independent. This is not a serious approximation as explained later because the noise in avalanche buildup is most sensitive to the current value at the beginning of the avalanche process and hence the effective $I_{ei}$ value to be used is the current value at this time instant.

A pure sinusoidal voltage is postulated across the avalanche zone even under large-signal operation, and furthermore it is assumed that the ionization coefficient is also sinusoidal in time. These assumptions are good approximations even under very large-signal operation.

$$\frac{\alpha L_a - 1}{\omega_o \tau_1} = -A + B \sin \omega_o t \quad (2.2)$$

In the absence of a saturation current, $A = 0$.[3] When $I_{ei} \neq 0$, a finite positive value of A is needed in order to obtain a finite dc current. As can readily be seen, the dc current solution to equation (2.1) diverges for $I_{ei}$ finite with $A = 0$.

Section III: Signal Analysis

In considering the signal solution of equation (2.1), the noise generating term $g(t)$ is first neglected. The general solution can be given in closed form as:

$$I_{ca}(t) = \exp - [A\omega_o t + B(\cos \omega_o t - 1)] \left[ I_{ca}(t = 0) + \frac{I_{ei}}{\tau_1} \int_0^t \exp [A\omega_o t' + B(\cos \omega_o t' - 1)] dt' \right]. \quad (3.1)$$

Since A is a positive quantity, the effect of the boundary condition which here specifies the current $I_{ca}$ at $t = 0$ disappears from the solution after a sufficient time. Thus, after the effect of initially imposed boundary conditions has disappeared, the avalanche conduction current may be written:

$$I_{ca}(t) = \frac{I_{ei}}{\tau_1} \exp - [A\omega_o t + B \cos \omega_o t] \int^t \exp [A\omega_o t' + B \cos \omega_o t'] dt'. \quad (3.2)$$

Introducing the expansions in terms of modified Bessel functions, $$\exp \pm (B \cos \omega_o t) = \sum_{n = -\infty}^{\infty} (\pm 1)^n I_n(B) \exp jn\omega_o t, \quad (3.3)$$

the integral in equation (3.2) may be carried out and be combined with the exponential factor with the result:

$$I_{ca}(t) = \frac{I_{ei}}{\omega_o \tau_1} \exp - B \cos \omega_o t \sum_m \frac{I_m(B)}{A + jm} \exp jm\omega_o t \quad (3.4)$$

$$= \frac{I_{ei}}{\omega_o \tau_1} \sum_{n,m} (-1)^n \frac{I_m(B)I_n(B)}{A + jm} \exp j(n + m)\omega_o t.$$

The $q^{th}$ Fourier component of the current $\hat{I}_{ca}(q)$ is $(n+m = q)$:

$$I_{ca}(q) = \frac{I_{ei}}{\omega_o \tau} \sum_{n=-\infty}^{\infty} (-1)^n \frac{I_n(B)I_{q-n}(B)}{A + j(q-n)} \quad (3.5)$$

$$= \frac{I_{ei}}{\omega_o \tau_1} \sum_{n=-\infty}^{\infty} (-1)^n I_n(B)I_{n+q}(B) \frac{1}{A + j(n+q)}$$

The second part of equation (3.5) follows from the first by changing the sign of the summation variable $n$ and observing that $I_n(B) = I_{-n}(B)$. For $q=0$ the dc current is obtained as a function of A and B. In particular for a given oscillation amplitude B and dc current $I_{ca}(0)$, A can be calculated which is related to the dc voltage fall-back during oscillation via the field and thus voltage-dependence of $\alpha 0$ in equation (2.2). The total current at $\bullet_o$ is obtained by adding the displacement current $j\omega_o \epsilon$ Area $V_a/L_a$, where $\epsilon 0$ is the dielectric constant, Area is the cross sectional area of the diode, $V_a$ is the voltage across the avalanche zone, and $L_a$ is the length of the avalanche zone. The diode current $I_d(1)$ at the fundamental frequency thus becomes:

$$I_d(1) = I_{ca}(1) + j\omega_o C_a V_a \quad (3.6)$$

where $C_a$ is the avalanche region capacitance $$C_a = \epsilon \text{ Area}/L_a. \quad (3.7)$$

The diode voltage may be evaluated by integrating the electric field throughout the diode of length L. In the avalanche zone this field is $V_a/L_a$, while in the drift region the field becomes modified by the charge of the flowing carriers. Integration gives:

$$V_d(1) = \frac{L}{L_a} V_a + \frac{I_{ca}(1)}{j\omega_o C_d} (1 + F) \quad (3.8)$$

where $C_d$ is the capacitance of the drift region of length $L_d$, $$C_d = \epsilon \text{ Area}/L_d, \quad (3.9)$$

and $$F = \frac{\exp(-j\omega_o \tau_d) - 1}{j\omega_o \tau_d} \quad (3.10)$$

where $\tau_d$ is the transit time of a carrier through the drift region.

Equation (3.8) may be used to express the diode current in terms of the diode voltage $V_d(1)$ and to obtain from equation (3.6):

$$I_d(1) = I_{ca}(1)\left[ -\frac{L_d}{L} F + \frac{L_a}{L} \right] + j\omega_o C V_d(1). \quad (3.11)$$

In equation (3.11) C is the capacity of a diode of total length L.

In the numerical calculations $I_d(1)$ and $V_d(1)$ are expressed in terms of the parameters A and B. $I_{ca}(1)$ has already been expressed in terms of those quantities in equation (3.5). A Taylor series expansion of the left side of equation (2.2). to the first order in the ac electric field reveals the relationship between B and $V_a$ needed to express equation (3.8) for $V_d(1)$ and equation (3.11) for $I_d(1)$ in terms of A and B alone:

$$V_a = \frac{B\omega_0 \tau_1}{j2\alpha'}. \quad (3.12)$$

The quantity $\alpha'$ is the derivative of $\alpha$ with respect to electric field.

The large-signal admittance of the diode $Y_d$ is given by:

$$Y_d = \frac{I_d(1)}{V_d(1)} \quad (3.13)$$

For convenience a few more expression for other diode parameters will be given which are needed to compare theory and experiment with straightforward derivations omitted. The power output $P_{out}$ of the diode is given by:

$$P_{out} = 2\text{Re}[V_d(1)^* I_d(1)]. \quad (3.14)$$

The efficiency is:

$$\eta = \frac{P_{out}}{I_{ca}(0) V_d(0)}, \quad (3.15)$$

where the dc voltage $V_d(0)$ is given by:

$$V_d(0) = E_o L_a + (E_o - E_{step})L_d - \frac{L_d^2}{2\epsilon}\left[ eN_d - \frac{I_{ca}(0)}{\text{Area } v} \right]. \quad (3.16)$$

In equation (3.17), a low-high-low profile is assumed where the doping spike causes an electric field step of magnitude $E_{step}$, $N_d$ is the doping in the drift region, $v$ is the saturated velocity, and the dc field in the avalanche zone $E_o$ is given by:

$$E_o = b\left(\left|\ln \frac{1 - A\omega_o \tau_1}{aL_a}\right|\right)^{-\frac{1}{2}}, \quad (3.17)$$

where the ionization coefficient $\alpha$ has been assumed to have the dependence on filed E given by:

$$\alpha = a \exp - \left(\frac{b}{E}\right)^2. \quad (3.18)$$

Section IV: Noise Analysis

Equation (2.1) including the term $g(t)$ can again be integrated in closed form following reference 4. The solution is the signal current already discussed in Section III plus an additional current $i_p(t)$ which is called the primary noise current and which is given by:

$$i_p(t) + \exp[-A\omega_o t - B \cos \omega_o t] \int_0^t \exp[A\omega_o t' + B \cos \omega_o t'] \frac{g(t')}{\tau_1} dt'. \quad (4.1)$$

Once $i_p(t)$ is evaluated, $i_p(t)$ must be supplemented with the "feedback" caused by the voltage across the avalanche region which is produced by the current $i_p(t)$ as it flows through the drift region and the outside circuit.

Following Goedbloed et al.[3], $g(t)$ consists of a sum of current impulses of charge $e$ where $e$ is the charge of an electron. The noise current due to a single event at time $t=t_o$ is described by:

$$g(t) = e\, \delta(t-t_o). \quad (4.2)$$

The associated impulse response $h(t,t_o)$ of $i_p(t)$ follows straightforwardly from an integration of equation (4.1) as: for $t \geq t_o$, $$h(t,t_o) =$$
$$\frac{e}{\tau_1} \exp(-A\omega_o t - B\cos\omega_o t)\exp(A\omega_o t_o + B\cos\omega_o t_o),$$

and for $t < t_o$,
ti $h(t,t_o) = 0$.

Following Convert[5], the rate $r(t)$ of occurrence of these statistical events is:

$$r(t) = \frac{1}{e}(I_{ei} + \alpha L_a I_{ca}(t)). \quad (4.4)$$

In other words the injection of an electron into the spacecharge region or an ionization event is the primary origin of noise.

Equation (4.3) offers insight into the noise mechanism and permits qualitative prediction of the main features of our noise results. Equation (4.3) described the noise current as a function of time $t$ produced by a single ionization event in the avalanche zone or by a single injected electron due to the effective injection current $I_{ei}$ occurring at the time $t=t_o$. It states that noise events at certain times $t_o$ are much more effective in producing net noise currents than events occurring at other times. Maximum weighting of primary noise events occurs when:

$$A\omega_o t_o + B\cos\omega_o t_o = \max \quad (4.5)$$

or when
$$-A + B\sin\omega_o t_o = 0. \quad (4.6)$$

Referring to equation (2.2) it is shown that equation (4.6) is fulfilled when $\alpha L_a = 1$. In FIG. 1 $\alpha L_a$ is plotted as a function of time. It is seen that $\alpha L_a$ oscillates sinusoidally around the value $1-A\omega_o\tau_1$. In previous theories which neglect $I_{ei}$ and set $A=0$, $\alpha L_a$ oscillates around 1. During one cycle $\alpha L_a$ crosses the value of 1 twice, once on the way up, and once on the way down. Only when $\alpha L_a$ crosses 1 on the way up is the expression of equation (4.3) a maximum. A very sharp weighting occurs around the point $\alpha L_a = 1$ for large amplitudes since B is proportional to the oscillation amplitude. At $\alpha L_a = 1$, the rate of primary noise events is proportional to $I_{ca}+I_{ei}$ according to equation (4.4). Since the current $I_{ca}$ only starts its rapid rise for values of $\alpha L_a > 1$, $I_{ca}$ is still rather small at this instant and still comparable to $I_{ei}$. In other words, the quantity $I_{ei}$ strongly determines the noise currents for large amplitudes B. In the limit of small values of B or under small-signal conditions, the noise sampling is more uniform in time and the noise dependence on $I_{ei}$ disappears.

Equation (4.3) also shows at which time the noise current has grown to its maximum after having been initiated at $t=t_o$. Obviously this occurs when:

$$-A\omega_o t - B\cos\omega_o t = \max \quad (4.7)$$

Figure 4:
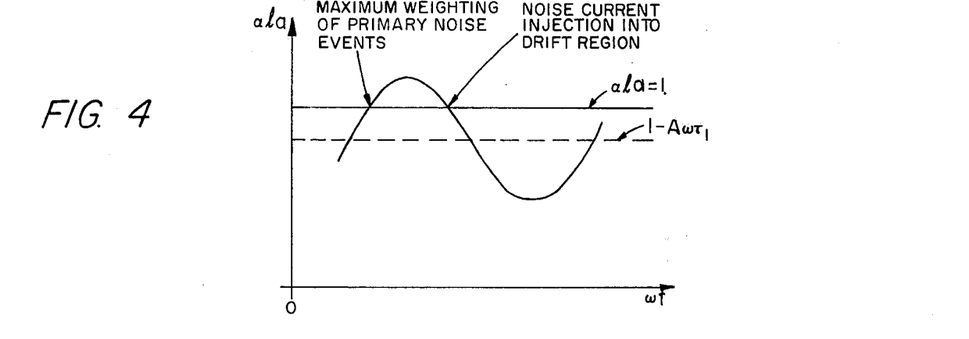
FIG. 4 is a graph showing avalanche conditions as a function of time for a Read-type diode.

Equation (4.7) leads again to the condition that $\alpha L_a = 1$. This time, however, the maximum occurs when $\alpha L_a$ crosses 1 on the way down as shown in FIG. 4.

Equation (4.3) may now be adapted for further evaluation. Expanding (4.3), using equation (3.3) there is obtained:

$$h(t,t_o) = \frac{e}{\tau_1} \exp -A\omega_o(t-t_o) \cdot \quad (4.8)$$
$$\sum_{n,m=-\infty}^{\infty} (-1)^n I_n(B) I_m(B) \exp jn\omega_o t \, \exp jm\omega_o t_o ,$$

for $t > t_o$. The Fourier coefficient of $h(t,t_o)$ at the frequency $q\omega_o$ describing this single noise event is given by:

$$H(q,t_o) = \int_{t=t_o}^{\infty} h(t,t_o) e^{-jq\omega_o t} dt \quad (4.9)$$

Carrying out the integration yields:

$$H(q,t_o) = \quad (4.10)$$
$$\frac{e}{\omega_o \tau_1} \sum_{n,m} (-1)^n \frac{I_n(B) I_m(B) \exp j(n+m-q)\omega_o t_o}{A + j(q-n)}$$

Here $q$ is not necessarily an integer. When $q$ is close to an integer, the Fourier component of the noise near one of the harmonics of the carrier is obtained. In practice, the noise near $\omega_o$ is of greatest interest and also near zero frequency within a band $\Delta\omega$ around these frequencies. The Fourier transform $H(q,t_o)$ will be relatively "flat" within a band $\Delta\omega/\omega_o$ around the $q^{th}$ harmonic, i.e., for a deviation of $q$ from an integer by $$\Delta q \leq \frac{\Delta\omega}{\omega_o},$$

if the replacement of $q$ by an integer will affect negligibly the summation in equation (4.10). The critical term is the term with q-n near zero. Hence $H(q,t_o)$ will be flat when $\Delta q \leq \Delta\omega/\omega_o << A$. Henceforth this inequality will be assumed to be satisfied and only integer $q$'s will be considered.

Equation (4.10) may now be written in a form useful for later calculations by writing:

$$H(q,t_o) = \frac{e}{\omega_o \tau_1} \sum_{p=-\infty}^{\infty} S_q(p) \exp -j(q+p)\omega_o t_o, \quad (4.11)$$

where $$S_q(p) = \sum_n (-1)^n \frac{I_n(B) I_{n+p}(B)}{A + j(q-n)} \quad (4.12)$$

Section V: Short Noise Currents

In this section the short circuit diode noise current is calculated at frequency $\omega_o$. The noise current is added to the signal current due to the presence of the noise source $g(t)$ in equation (2.1). In evaluating the noise current, the signal currents and signal voltage terminations are fixed. Thus when evaluating the short circuit noise current, the ac noise voltage across the diode is set to zero, and the signal termination is not changed.

In normal diode operation, the dc current is stabilized by a large bias resistor $R_{bias}$. The primary noise currents produce voltage drops in the drift region of the diode and in the case of the dc current also in the outside circuit. Thus voltages are produced across the avalanche zone due to the primary noise currents which in turn produce secondary currents.

The intent is to calculate the total of the primary and the secondary currents at frequency $\omega_o$. In a first step the voltage $v_a(1)$ is calculated across the avalanche zone due to particle currents $i_{ca}(1)$ and $i_{ca}(0)$ injected into the drift region. From equation (3.8) there is obtained for $v_a(1)$ with $V_d(1)=0$.

$$V_a(1) = -i_{ca}(1)\frac{1}{Y_c}, \qquad (5.1)$$

where $$Y_a = \frac{L}{L_a}\frac{j\omega_o C_d}{F+1}. \qquad (5.2)$$

Lower case letters are used for noise voltages and currents in equation (5.1) and in the following formulations to distinguish them from signal voltages and currents.

Similarly, there is obtained at zero frequency:

$$V_a(0) = -i_{ca}(0)\frac{L_a}{L}(R_{bias} + R_{sp.\,ch.}) \qquad (5.3)$$

$$= -i_{ca}(0)R$$

where $R_{sp.ch.}$ is the space charge resistance given by:

$$R_{sp.\,ch.} = \frac{L_a^2}{2\epsilon v\,\text{Area}}.$$

Furthermore, $$R = \frac{L_a}{L}(R_{bias} + R_{sp.\,ch.}) \qquad (5.5)$$

In a second step are calculated the response of the avalanche zone to a small noise voltage of the form $v_a(0) + v_a(1)\exp j\omega_o t + v_a^*(1)\exp -j\omega_o t$ which is assumed to exist in addition to the large oscillation amplitudes.

Equation (2.2) is modified to:

$$\frac{\alpha L_a - 1}{\omega_o \tau_1} = -A + B\sin\omega_o t + \frac{\alpha'}{\omega_o \tau_1}(v_a(1)\exp j\omega_o t + \qquad (5.6)$$

$$v_a^*(1)\exp -j\omega_o t) + \frac{\alpha'}{\omega_o \tau_1}v_a(0)$$

In equation (5.6) $\alpha'$ is the derivative with respect to the electric field of the carrier ionization coefficient.

Next, equation (5.6) is substituted into equation (2.1) with $g(t)$ omitted from the right-hand side. By expanding exponentials in $v_a(1)$ to the first order, there are obtained for the solution in close analogy to the signal case:

$$I_{ca}(t) + i_{ca}(t) = \frac{I_{el}}{\tau_1}\exp\left[-\left(A\omega_o\frac{\alpha'}{\tau_1}v_a(0)\right)t - B\cos\omega_o t\right]$$

$$\left[1 + \frac{\alpha'}{j\omega_o \tau}(v_a(1)\exp j\omega_o t - v_a(1)^*\exp -j\omega_o t)\right]$$

$$\times \int^t \exp\left[\left(A\omega_o\frac{\alpha'}{\tau_1}v_a(0)\right)t' + B\cos\omega_o t'\right] \qquad (5.7)$$

$$\left[1 - \frac{\alpha'}{j\omega_o \tau_1}(v_a(1)\exp j\omega_o t' - v_a^*(1)\exp -j\omega_o t')\right]dt'.$$

The expansions equation (3.3) are next used to then carry out the integrations. There will be terms at all harmonics of $\omega_o$. By collecting all terms at frequency $\omega_o$ and 0, expressions for the currents induced by the small-signal voltages $v_a(0)$ and $v_a(1)$ are obtained:

$$i_{ca}(1) = g_{11}v_a(1) + g_{11}v_a^*(1) + g_{10}v_a(0), \qquad (5.8)$$

and $$i_{ca}(0) = g_{01}v_a(1) + g_{01}{}^*v_a^*(1) + g_{00}v_a(0), \qquad (5.9)$$

where the $g$'s are sums to be given below. The $g$'s are referred to as avalanche zone admittances. The peculiar appearance of $v_a^*(1)$ is due to the fact that the phase of the noise voltage $v_a$ with respect to the signal voltage is important. In other words, the avalanche zone has a different admittance for a noise voltage in phase with the signal or in quadrature with the signal.

After some straightforward manipulations which are not reproduced here, this is obtained from equation (5.7):

$$g_{11} = j\frac{I_{el}\alpha'}{(\omega_o \tau_1)^2}\sum_{n=-\infty}^{+\infty}(-1)^n I_n(B)^2\left[\frac{1}{A+j(n+1)} - \frac{1}{A+jn}\right], \qquad (5.10)$$

$$\overline{g_{11}} = j\frac{I_{el}\alpha'}{(\omega_o \tau_1)^2}\sum_{n=-\infty}^{+\infty}(-1)^n I_n(B)I_{n+2}(B)\left[\frac{1}{A-j(n+2)} - \frac{1}{A+j(n+1)}\right], \qquad (5.11)$$

$$g_{01} = j\frac{I_{el}\alpha'}{(\omega_o \tau_1)^2}\sum_{n=-\infty}^{+\infty}(-1)^n I_n(B)I_{n+1}(B)\left[\frac{1}{A-jn} - \frac{1}{A+j(n+1)}\right], \qquad (5.12)$$

$$g_{10} = \frac{I_{el}\alpha'}{(\omega_o \tau_1)^2}\sum_{n=-\infty}^{+\infty}(-1)^n I_n(B)I_{n+1}(B)\frac{1}{[A+j(n+1)]^2}, \qquad (5.13)$$

and $$g_{00} = \frac{I_{el}\alpha'}{(\omega_o \tau_1)^2}\sum_{n=-\infty}^{+\infty}(-1)^n I_n(B)^2\frac{1}{[A+jn]^2}. \qquad (5.14)$$

The notation $g_{10}$ refers to an admittance which produces a current at $\omega_o$ due to a voltage at frequency zero with corresponding meanings for the other symbols.

In order to evaluate the total avalanche conduction currents due to one noise event, there must be added to equations (5.8) and (5.9) the primary equation (4.11) to then obtain the following expressions for the noise currents per unit frequency $\Delta f$:

$$f_{ca}(1) = g_{11}v_a^*(1) + g_{11}v_a(1) = g_{10}v_a(0) + H(1,t_o) \quad (5.15)$$

$$i_{ca}(0) = g_{01}v_a(1) + g_{01}^*v_a^*(1) + g_{00}v_a(0) + H(0,t_o) \quad (5.16)$$

In order to evaluate the noise current of interest at the operating frequency $i_{ca}(1)$, $v_a(1)$ is eliminated by using equation (5.1) and $i_{ca}(0)$ by using equation (5.3). $i_{ca}(1)$ may then be calculated from equations (5.15) and (5.16) and their complex conjugates. Before determining that expression, it should be borne in mind that the primary interest lies in the diode terminal current which is related to the current injected into the drift region by the transport factor $$\left( -\frac{L_{d_F}}{L} + \frac{L_a}{L} \right).$$

With the inclusion of the transport factor the short circuit diode noise current $i_d(1)$ per unit frequency becomes:

$$i_d(1) = Q[H(1,t_o) - H(0,t_o)T] \quad (5.17)$$
$$+ P^*[H(1,t_o)^* - H(0,t_o)T^*].$$

In equation (5.17) the zero frequency Fourier component of the noise current $H(0,t_o)$ is real and thus the complex conjugate sign is omitted.

The quantity T is defined by $$T = g_{10}/(g_{00} + R^{-1}) \quad (5.18)$$

Furthermore, the quantities P* and Q are given by $$P^* = -\frac{Y_g^{(2)}Y_c}{(Y_c + Y_g^{(1)})(Y_c^* + Y_g^{(1)*}) - Y_g^{(2)}Y_g^{(2)*}} \quad (5.19)$$

$$\left( -F\frac{L_d}{L} + \frac{L_a}{L} \right)$$

and $$Q = \frac{Y_c(Y_c^* + Y_g^{(1)*})}{Y_c + Y_g^{(1)}(Y_c^* + Y_g^{(1)*}) - Y_g^{(2)}Y_g^{(2)*}} \quad (5.20)$$

$$\left( -F\frac{L_d}{L} + \frac{L_a}{L} \right)$$

In equations (5.19) and (5.20), $Y_c$ is given by equation (5.2). Furthermore, $Y_g^{(1)}$ and $Y_g^{(2)}$ are defined by:

$$Y_g^{(1)} = g_{11} - Tg_{01} \quad (5.21)$$

$$Y_g^{(2)} + g_{11} - Tg_{01}^* \quad (5.22)$$

For later use it will be convenient to define an "effective" primary noise current $i_e(1,t_o)$ per unit frequency at frequency $\omega_o$, composed of the contributions to $i_d(1)$ of both $H(1,t_o)$ and $H(0,t_o)$:

$$i_e(1,t_o) = H(1,t_o) - H(0,t_o)T \quad (5.23)$$

so that equation (5.17) becomes:

$$i_d(1) = Qi_e(1,t_o) + P^*i_e^*(1,t_o). \quad (5.24)$$

The mean square value of $i_d(1)$ is a linear function of $i_e(1,t_o)i_e^*(1,t_o)$, $i_e(1,t_o)i_e(1,t_o)$ and the complex conjugate of the latter.

Using equation (4.11), an individual ionizing event at $t_o$ produces:

$$i_e(1,t_o) = \frac{e}{\omega_o \tau_1}\left[ \sum_{m=-\infty}^{\infty} S_1(m) \exp - j(1+m)\omega_o t_o - T\sum_{m=-\infty}^{\infty} S_o(m) \exp - jm\omega_o t_o \right]. \quad (5.25)$$

This expression of equation (5.25) may be rewritten by defining $$S(m) = S_1(m) - TS_o(m+1) \quad (5.26)$$

$$\overline{S}(m) = S_1(m) - TS_o(m+1) \quad (5.26)$$

$$i_e(1,t_o) = \frac{e}{\omega_o \tau_1} \sum_{m=-\infty}^{\infty} \overline{S}(m) \exp - j(1+m)\omega_o t_o \quad (5.27)$$

The correlation function $i_e(1,t_o)e_e^*(1,t_o)$ results by averaging over the statistics of the individual ionizing events. These are assumed mutually uncorrelated and according to equation (4.4) of statistical weight $(dt_o/eT)[\alpha(t_o)L_aI_{ca}(t_o)+I_{ei}]$, where $T$ is the period, $T = 2\pi/\omega_o$. This may be mathematically expressed as:

$$\overline{i_e(1,t_o)i_e^*(1,t_o)} = \overline{i_e^{(1)}i_e^{*(1)}} = \quad (5.28)$$
$$\frac{1}{T}\int_0^T dt_o(\alpha L_aI_{ca}(t_o) + I_{ei})i_e(1,t_o)i_e^*(1,t_o).$$

In equation (5.28) $t_o$ may be omitted in the definition of the correlation function where an average over $t_o$ has been performed. Using equations (5.27) and (5.28), there is obtained:

$$\overline{i_e(1)i_e^*(1)} = \frac{e}{\omega_o^2\tau_1^2}\frac{1}{T}\int_0^T dt_o$$
$$\sum_{m,n} \overline{S}(m)\overline{S}^*(n) \exp -j(m-n)\omega_o t_o$$
$$\left[ I_{ei} + \sum_{q=-\infty}^{\infty} I_{ca}(q) \exp j\omega_q t_o \left( (1 - A\omega_o\tau_1) + \frac{B\omega_o\tau_1}{2j}(\exp j\omega_o t_o - \exp -j\omega_o t_o) \right) \right] \quad (5.29)$$

In the numerical studies following all $S(m)$ terms from $m=-6$ to $m=+3$ have been retained. In order to keep the expressions within a reasonable space, there are reproduced here $i_e(1)i_e^*(1)$ and $i_e(1)i_e(1)$ retaining only the terms $S(m)$ from $m=-1$ to $m=+1$. Those expressions may readily be extrapolated to include more terms.

$$\overline{i_e(1)i_e^*(1)} = \frac{e}{\omega_o^2\tau_1^2}\left( I_{ie} + I_{ca}(0)\left(1 - A\omega_o\tau_1\right) \right)$$

-continued $$+ \frac{B\omega_o \tau_1}{2j} \Big( I_{cd}(-1) + I_{cd}(1) \Big) \Big\}$$

$$\Big\{ |\overline{S}(-1)|^2 + |\overline{S}(0)|^2 + |\overline{S}(1)|^2 \Big\}$$

$$+ 2Re\Big\{ \Big[ \Big( 1 - A\omega_o \tau_1 \Big) I_{cd}(1) +$$

$$\frac{B\omega_o \tau_1}{2j} \Big( I_{cd}(0) - I_{cd}(2) \Big) \Big]$$

$$\Big[ \overline{S}(0)\overline{S}^*(-1) + \overline{S}(1)\overline{S}^*(0) \Big] \Big\}$$

$$+ 2Re\Big\{ \Big[ \Big( 1 - A\omega_o \tau_1 \Big) I_{cd}(2) +$$

$$\frac{B\omega_o \tau_1}{2j} \Big( I_{cd}(1) - I_{cd}(3) \Big) \Big]$$

$$\Big[ \overline{S}(1)\overline{S}^*(-1) \Big] \Big\} \quad (5.30)$$

$$\overline{i_c(1)i_c(1)} = \frac{e}{\omega_o^2 \tau_1^2} \Big[ \Big( 1 - A\omega_o \tau_1 \Big) I_{cd}(0) + I_{el}$$

$$+ \frac{B\omega_o \tau_1}{2j} \Big( I_{cd}(-1) - I_{cd}(1) \Big) \Big] \overline{S}(-1)^2$$

$$+ \Big[ \Big( 1 - A\omega_o \tau_1 \Big) I_{cd}(1) +$$

$$\frac{B\omega_o \tau_1}{2j} \Big( I_{cd}(0) - I_{cd}(2) \Big) \Big] 2\overline{S}(-1)\overline{S}(0)$$

$$+ \Big[ \Big( 1 - A\omega_o \tau_1 \Big) I_{cd}(2) +$$

$$\frac{B\omega_o \tau_1}{2j} \Big( I_{cd}(1) - I_{cd}(3) \Big) \Big]$$

$$\Big[ 2\overline{S}(-1)\overline{S}(1) + \overline{S}(0)^2 \Big]$$

$$+ \Big[ \Big( 1 - A\omega_o \tau_1 \Big) I_{cd}(3) +$$

$$\frac{B\omega_o \tau_1}{2j} \Big( I_{cd}(2) - I_{cd}(4) \Big) \Big] 2\overline{S}(0)\overline{S}(1)$$

$$+ \Big[ \Big( 1 - A\omega_o \tau_1 \Big) I_{cd}(4) +$$

$$\frac{B\omega_o \tau_1}{2j} \Big( I_{cd}(3) - I_{cd}(5) \Big) \Big] \overline{S}(1)^2 \quad (5.31)$$

Section VI: Noise Measure

In complete analogy to the small-signal noise measure of avalanche diodes, the noise measure is defined here as the ratio of the square of the short-circuit noise current leaving the diode terminals and the square of the short-circuit thermal noise current produced by a conductor with an admittance $|ReY_d|$ where $Y_d$ is the large-signal admittance of the avalanche diode. It is useful to further refine the noise measure definitions by observing that under large-signal conditions the noise currents show a preferential phase relationship with respect to the signal. It is well known that for an oscillator (see for example reference 6) the amplitude modulation noise is driven by those noise currents which are in phase with the diode voltage while the frequency modulation noise is driven by those noise currents which are in quadrature with the diode voltage. In small-signal operation these two noise current components are, of course, of equal magnitude, but as the signal amplitude grows, differences may be generated. From the signal analysis, the diode terminal voltage may be written:

$$V_d(1) = |V_d(1)| exp\, j\phi. \quad (6.1)$$

By multiplying the short circuit noise current $i_c(1)$ with $exp\, -J\phi$, the phase of the noise voltage may be referenced to that of the signal voltage. With that reference phase, the total noise current at $\omega_o$, for unit bandwidth, as a function of time can be written:

$$i_c(t) = i_c(1)exp\, -j\phi\, exp\, j\omega_o t + i_c(1)^* exp\, j\phi\, exp\, -j\omega_o t$$
$$= cos\omega_o t[i_c(1)\, exp\, -j\phi + \text{complex conjugate}] + j$$
$$sin\omega_o t\, [i_c(1)\, exp\, -j\phi - \text{complex conjugate}] = cos$$
$$\omega_o t\, [N\, i_c(1,t_o) + \text{complex conjugate}] + j\, sin\, \omega_o t\, [N$$
$$i_c(1,t_o) - \text{complex conjugate}].$$

Equation (5.24) has been used in equation (6.2) as have the abbreviatins:

$$N = Q\, exp\, -j\phi + P\, exp\, j\phi \quad (6.3)$$

and $$N = Q\, exp\, -j\phi - P\, exp\, j\phi. \quad (6.4)$$

Finally $M_{AM}$ and $M_{FM}$ may be written by taking the absolute magnitude squared of the cosine and sine components respectively. The time average and also weight of the various primary noise events are taken at times $t_o$ at the rate at which these noise events occur. As outlined in part in equations (5.30) and (5.31), this leads to:

$$M_{AM} = \frac{\overline{NN^* i_c(1)i_c^*(1)} + Re\overline{(N^2 i_c(1)^2)}}{2kT|ReY_d|} \quad (6.5)$$

and $$M_{FM} = \frac{\overline{NN^* i_c(1)i_c^*(1)} - Re\overline{(N^2 i_c(1)^2)}}{2kT|ReY_d|} \quad (6.6)$$

In the denominator of equations (6.5) and (6.6) only half of the thermal noise per unit bandwidth produced by a conductor iof magnitude $|ReY_d|$ is used since a distortion is made in both numerator and denominator between in-phase and out-of-phase noise. The thermal noise, of course, is of equal magnitude for both the in-phase and quadrature components. When evaluating oscillator noise, the conventional formulas derived in conjunction with the van der Pol oscillator may be used;[6] however, for the FM noise formula $M_{FM}$ is to be substituted for M with a similar change for AM noise. This will be done in the following section.

Section VII: Comparison of Experiments with Theory

Data as to noise measure has been taken on various GaAs Read diode oscillators. It is observed in general that the noise measure $M_{FM}$ can vary considerably between diodes of different construction. In particular, it was discovered early that diodes which show a "softer" breakdown in the I–V characteristic or which, in other words, have a higher current show noise measures which are lower by 10 dB or more from diodes with a sharp breakdown characteristic. It was also observed that most of the diodes measured show noise measures which decrease with incresing power outputs. This previously unexpected behavior could be explained by observing that at the higher power levels the diode is hotter and thus the saturation current is higher, suppressing the noise. The other portion of noise reduction was affected by a longer drift angle through the drift region. In the nonlinear region, in analogy to the small-signal noise theory, a decreasing noise measure is found with increasing transit angle over some of the range. In a hotter diode the saturated drift velocity decreases due to increased lattice scattering,[7] and also the breakdown voltage increases due to lower ionization coefficients, both effects leading to a larger transit angle at the higher power operating point.

For comparison of experiment with theory, two diodes were selected which differed materially in noise performance. One diode had a relatively low noise measure whereas the other showed a larger noise measure. Both diodes had Schottky barrier contacts on gallium arsenide material with a low-high-low doping profile. In the following the lower-noise diode is referred to as Diode A, while the other one is referred to as Diode B.

Figure 5:
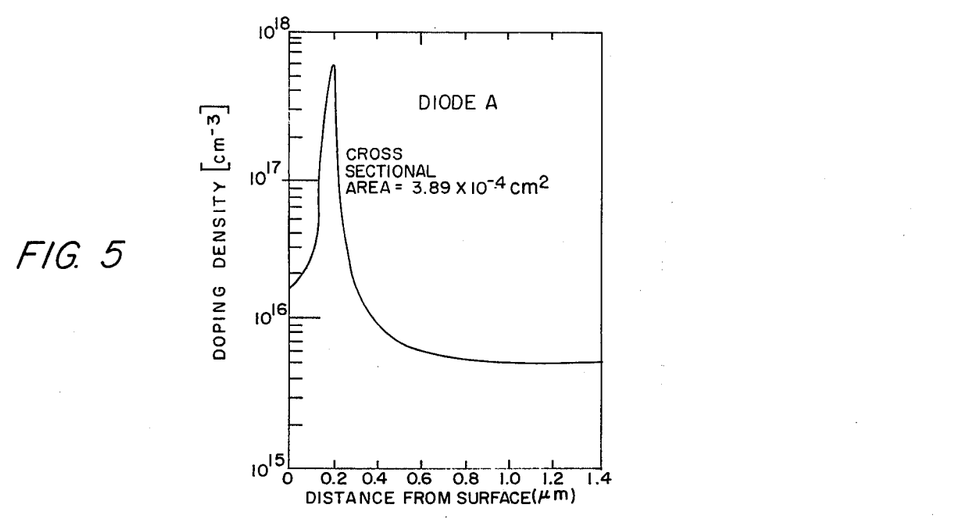
FIGS. 5 and 6 are graphs of the doping density of two different Read-type diodes.
Figure 6:
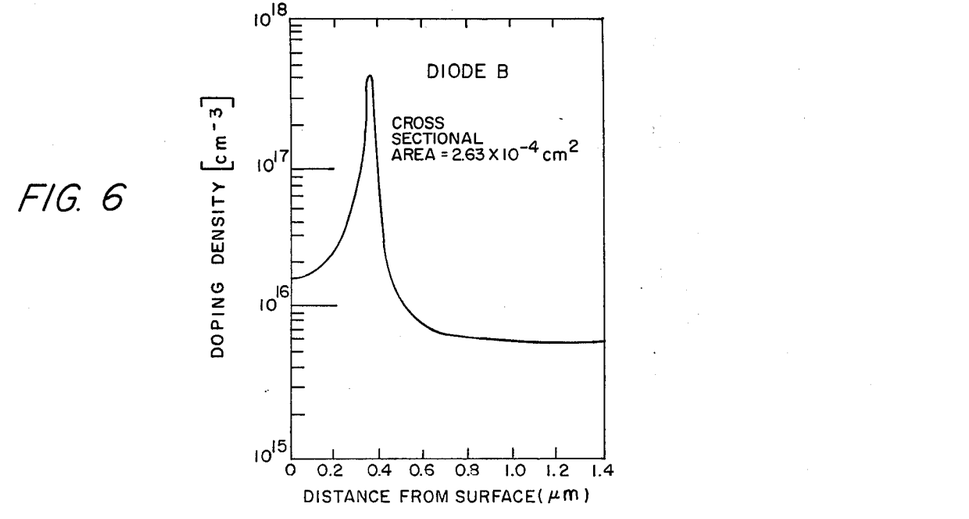

FIGS. 5 and 6 show respectively the doping density profiles of Diode A and B. Note that Diode A has a doping spike approximately 0.2 $\mu$m from the surface whereas the doping spike of Diode B is approximately 0.38 $\mu$m from the surface. The noise measure of the diodes was determined by measuring the root mean square frequency deviation $\Delta f$ of a locked oscillator. Of course, $\Delta f$ of the locked oscillator is lower than that of an unlocked oscillator. From Kurokawa[8] the relationship betwen the unlocked $\Delta f_u$ and locked $\Delta f_L$ is given by:

$$\frac{\Delta f_u}{\Delta f_L} = \frac{f_{max}}{f_m} \quad (7.1)$$

where $f_{max}$ is the maximum locking frequency and $f_m$ is the modulation frequency within the lock-in range at which $\Delta f_L$ is measured. The noise measure $M_{FM}$ is determined from the relationship:

$$\Delta f_u = \frac{f_o}{Q_{ext}} \sqrt{\frac{kT_oM_{FM}B_{eff}}{P}} \quad (7.2a)$$

$$= f_{max}\sqrt{\frac{kT_oM_{FM}B_{eff}}{P_L}} \quad (7.2b)$$

In equation (7.2), $f_o$ is the oscillator frequency, $Q_{ext}$ is the external Q, P is the power output, $P_L$ is the locking power, $k$ is Boltzamann's constant, and $T_o$ is the reference temperature. $B_{eff}$ is the actual bandwidth used in the noise measurement. For example, if FM noise is measured using a bandwidth B above and the same bandwidth symmetrically below the carrier, then $B_{eff}$ = 2B.

The FM noise test system was a reflection-cavity type microwave discriminator very similar to that described by Ondria.[9] The diodes each operated in an oscillator cavity of the resonant-cap type. The caps of 10mm diameter and 2.2 mm thickness were held approximately 1 mm above the wall of the WR-90 waveguide by the diode package. Waveguide tuning was provided by a non-contacting short circuit and a slide-screw tuner. The bias circuit was isolated by a two-section lowpass filter which serves to short microwave signals to the waveguide wall. The capacitance of this filter which is the principal susceptance seen by the diode at low frequencies was approximately 40 pf, a reactance of 4 k$\Omega$ at 1 MHz. A 56 $\mu$H inductor adjacent to the lowpass filter isolated the diode and filter from the remaining bias circuit wiring to prevent further capacitive shunting of the diode. Bias current from a voltage-regulated power supply was stabilized by a 500 ohm resistor.

The injection locking source was a reflex-klystron stabilized by a transmission wavemeter cavity to provide low FM noise. The locking signal is introduced to the oscillator by a three-port waveguide circulator.

Figure 7:
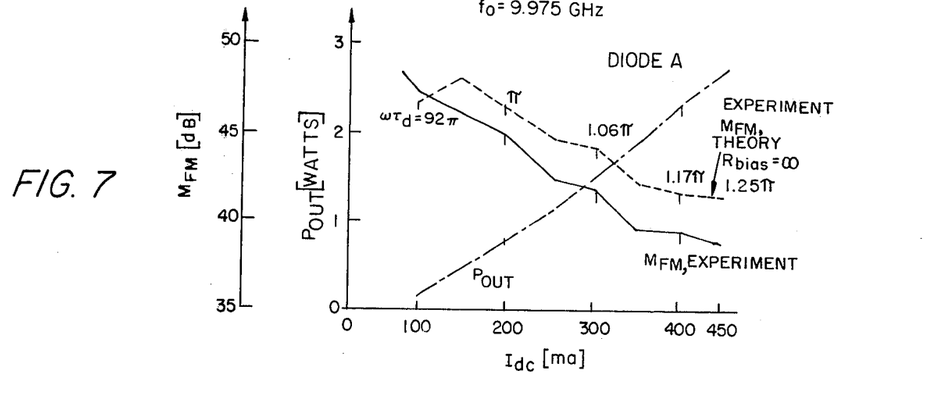
FIGS. 7 and 8 are graphs of the noise measure and output power versus input average dc current for the diodes of FIGS. 5 and 6 respectively.
Figure 8:
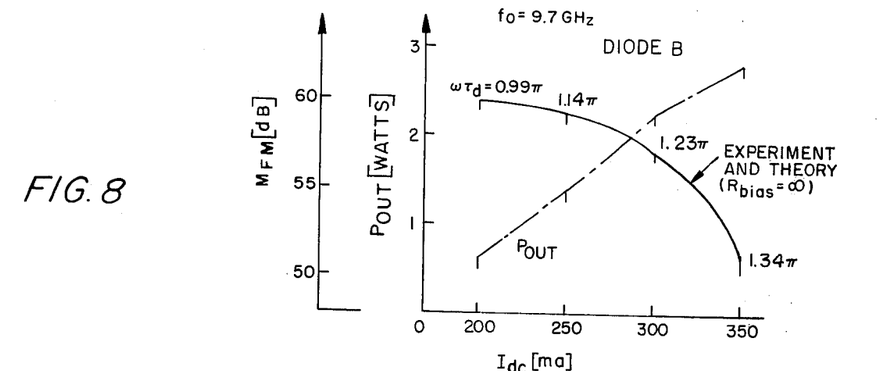

The experimental noise measure and power output of the two diodes is shown in FIGS. 7 and 8 respectively which are plotted against the dc bias current. Also shown in the figures are $M_{FM}$ values calculated in accordance with the theoretical expressions above using computer evaluation. The conditions under which these noise measures were calculated were as follows: In the calculations all Bessel functions of order $-20$ to $+20$ were included. The summations over $S(n)$ in equations (4.12) and (4.13) included terms from $n=-6$ to $n=+3$. The truncation errors were estimated by using fewer $S(n)$ terms in the summations and comparing the results. These errors even under the worst conditions are of the order of 0.1 dB. The calculations use equation (3.5) which gives for $q=0$ the dc current as a function of A and B. By studying defining equation (2.2) for A and B, it can be seen that A is related to the dc fallback voltage upon start of the oscillation while B is proportional to the ac voltae swing. For a given dc current $I_{cd}(0)$, for example, B can be calculated from equation (3.5) for a given A. With this given A,B pair, all other quantities such as power output, efficiency, noise measure, and so forth, can be evaluated provided all other paramters such as $I_{ei}$, $\omega\tau_1$, $\omega\tau_d$, etc., have also been specified.

There are some uncertainties in determining the transit angle $\omega\tau_d$ through the drift zone, since the doping profile has not been measured fully to the end of the space charge region and also the temperature dependence of the saturated drift velocity cannot be considered to be fully established. The approximate transit angle used in the calculation is indicated in the two figures.

The avalanche build-up time $\tau_1$ depends on the relative ionization coefficients for electrons and holes and also the type of carrier predominantly injected into the space charge region as is pointed out by Kuvas and Lee.[2] Using the data of ionization coefficients in GaAs by Stillman et al.[10] together with the fact that electrons emitted over the Schottky barrier primarily initiate the avalanche process, with the help of reference 2 it may be estimated that $\tau_1$ is approximately two-thirds the transit time of an electron through the avalanche zone. In the calculations, this value has been used.

The most critical parameter entering the calculations is the current. The I–V characteristics of the diodes have been measured as a function of temperature by placing the diodes into an oven simulating the temperature conditions that exist under oscillating conditions. It may be seen that the current really does not saturate. It has been proposed that tunnel-assisted thermionic emission through the Schottky barrier contact accounts for the observed current-voltage relationship. We find that there are serious discrepancies between the tunnel theory and the observed currents, notably in the temperature dependence of the slope in a plot of the logarithm of the current versus the square of the electric field at the Schottky barrier.

Figure 9:
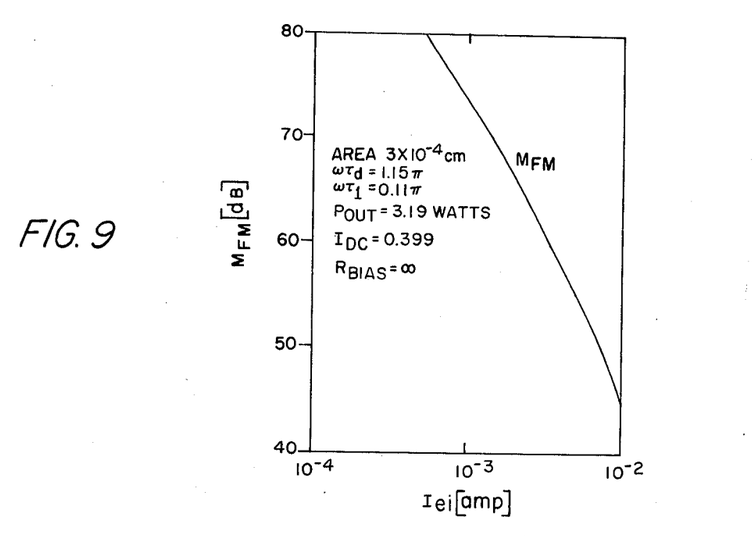
FIG. 9 is a graph of noise measure versus effective inection current for a diode using the invention.

To further aid in understanding the quantitative predictions of the present theory, we have plotted in FIG. 9 the noise measure $M_{FM}$ as a function of saturation current at a fixed transit angle and fixed power output. $M_{FM}$ is seen to decrease with increasing $I_{ei}$ following approximately a simple power law of the form $M_{FM} \sim I_{ei}^{-2.3}$ over much of the range.

Figure 10:
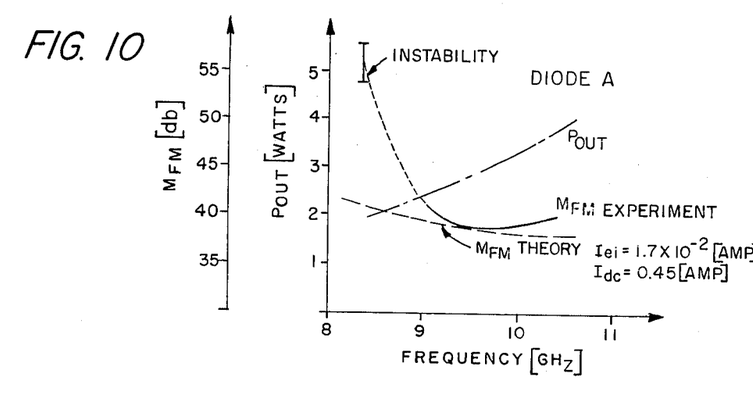
FIG. 10 is a graph of output power and noise measure versus frequency for a diode using the invention.

FIG. 10 shows the variation of $M_{FM}$ as a function of frequency or transit angle for a fixed saturation current. The parameters chosen represent those of Diode A. Also shown are experimental measurements on Diode A. As may be seen, the agreement between theory and experiment is reasonably good except for the experimental value measured at the lower end of the frequency range. The error bar indicates a temporal instability in that measurement, the reason of which is not known. The noise measure improves as the transit angle becomes large, not unlike the case known to exist in the low-power limit.

REFERENCES CITED

1. W. T. Read, Jr., "A Proposed High-Frequency, Negative-Resistance Diode," Bell Syst. Tech. J. 37, pp. 401–446 (March 1958).
2. R. Kuvas and C. A. Lee, "Quasistatic Approximation for Semiconductor Avalanches," J. Appl. Phys. 41, pp. 1743–1755 (March 1970).
3. J. J. Goedbloed and M. T. Vlaardingerbroek, "Noise in IMPATT Diode Oscillators at Large Signal Levels," IEEE Trans. Electron Devices ED-21, pp. 342–351 (1974).
4. E. Kamke, *Differentialgleichungen Losungsmethoden und Losungen*, (New York: Chelsea Publishing Co., 1959), p. 16.
5. P. G. Convert, "Sur la Theorie du Bruit des Diodes a Avalanche," Revue Technique Thomson-CSF 3, pp. 419–471 (Sept. 1971).
6. H. A. Haus, H. Statz, and R. A. Pucel, "Optimum Noise Measure of IMPATT Diodes," IEEE Trans. Microwave Theory and Techniques MTT-19, pp. 801–813 (Oct. 1971).
7. B. Kramer and A. Mircea, "Determination of Saturated Electron Velocity in GaAs," Appl. Phys. Letters 26, pp. 623–625 (June 1975).
8. K. Kurokawa, "Noise in Synchronized Oscillators," IEEE Trans. Microwave Theory and Techniques MTT-16, pp. 234–240 (April 1968).
9. J. G. Ondria, "A Microwave System for Measurement of AM and FM Noise Spectra," IEEE Trans. Microwave Theory and Techniques MTT-16, pp. 767–788 (Sept. 1968).
10. G. E. Stillman, C. M. Wolfe, J. A. Rossi, and A. G. Foyt, "Unequal Electron and Hole Impact Ionization Coefficients in GaAs," Appl. Phys. Letters 24, pp. 471–474 (May 1974).

What is claimed is:

1. A Read-type diode comprising in combination:
a Schottky-barrier forming metal contact;
an avalanche region of semiconductor material adjacent said Schottky-barrier forming metal contact, said avalanche region having a doping density in the range of $5 \times 10^{15}$ to $1 \times 10^{17}/cm^3$;
an avalanche termination region of semiconductor material adjacent said avalanche region, said avalanche termination region having a doping density in the range of $2 \times 10^{17}$ to $5 \times 10^{17}/cm^3$, said avalanche termination region being of sufficient thickness to reduce the electric field within said avalanche termination region below the level sufficient for causing charge carrier multiplication;
a drift region of semiconductor material adjacent said avalanche termination region, said drift region having a doping density in the range of $3 \times 10^{15}$ to $3 \times 10^{16}/cm^3$, the length of said drift region being determined in accordance with a preferred operating frequency of said diode; and
means for determining the effective injection current of said diode such that the noise measure of said diode is less than 50 db.

2. The diode of claim 1 wherein said diode produces an output signal power of at least one watt upon application to said diode of a bias voltage of predetermined magnitude.

3. The diode of claim 2 wherein said metal contact comprises a metal having a work function lower than the work function of platinum.

4. The diode of claim 2 wherein said metal contact comprises tungsten.

5. A Read-type diode comprising in combination:
a Schottky-barrier forming metal contact;
an avalanche region of semiconductor material adjacent said Schottky-barrier forming metal contact, said avalanche region having a doping density in the range of $5 \times 10^{15}$ to $1 \times 10^{17}/cm^3$;
an avalanche termination region of semiconductor material adjacent said avalanche region, said avalanche termination region having a doping density in the range of $2 \times 10^{17}$ to $5 \times 10^{17}/cm^3$, said avalanche termination region being of sufficient thickness to reduce the electric field within said avalanche termination region below the level sufficient for causing charge carrier multiplication;
a drift region of semiconductor material adjacent said avalanche termination region, said drift region having a doping density in the range of $3 \times 10^{15}$ to $3 \times 10^{16}/cm^3$, the length of said drift region being determined in accordance with a preferred operating frequency of said diode; and
means for determining the effective injection current of said diode such that the ratio of average dc current to effective injection current is less than 100.

6. The diode of claim 5 wherein said ratio of dc current to effective injection current is 30 or less.

7. The diode of claim 5 wherein said metal contact has a work function less than the work function of platinum or chromium.

8. The diode of claim 5 wherein said diode produces an output signal power of one watt or more upon application to said diode of a bias voltage sufficient to produce avalanching of charge carriers in the layer of semiconductor material adjacent said metal.

9. A Read-type diode comprising in combination:
a Schottky-barrier forming metal contact;
an avalanche region of semiconductor material adjacent said Schottky-barrier forming metal contact, said avalanche region having a doping density in the range of $5 \times 10^{15}$ to $1 \times 10^{17}/cm^3$;

an avalanche termination region of semiconductor material adjacent said avalanche region, said avalanche termination region having a doping density in the range of $2 \times 10^{17}$ to $5 \times 10^{17}/cm^3$, said avalanche termination region being of sufficient thickness to reduce the electric field within said avalanche termination region below the level sufficient for causing charge carrier multiplication;

a drift region of semiconductor material adjacent said avalanche termination region, said drift region having a doping density in the range of $3 \times 10^{15}$ to $3 \times 10^{16}/cm^3$, the length of said drift region being determined in accordance with a preferred operating frequency of said diode; and means for determining the ratio of effective injection current to junction area of said diode to be at least 30 amps/cm².

10. The diode of claim 9 wherein said diode has a noise measure less than 50 db.

11. The diode of claim 10 wherein said diode produces an output signal power of at least one watt upon application to said diode of a bias voltage of predetermined magnitude.

12. The diode of claim 9 wherein said metal contact comprises a metal having a work function lower than the work function of chromium or platinum.

13. An amplifying or oscillating circuit comprising in combination:

a Schottky-barrier forming metal contact;

an avalanche region of semiconductor material adjacent said Schottky-barrier forming metal contact, said avalanche region having a doping density in the range of $5 \times 10^{15}$ to $1 \times 10^{17}/cm^3$;

an avalanche termination region of semiconductor material adjacent said avalanche region, said avalanche termination region having a doping density in the range of $2 \times 10^{17}$ to $5 \times 10^{17}/cm^3$, said avalanche termination region being of sufficient thickness to reduce the electric field within said avalanche termination region below the level sufficient for causing charge carrier multiplication;

a drift region of semiconductor material adjacent said avalanche termination region, said drift region having a doping density in the range of $3 \times 10^{15}$ to $3 \times 10^{16}/cm^3$, the length of said drift region being determined in accordance with a preferred operating frequency of said diode;

a buffer region of semiconductor material adjacent said drift region, said buffer region being heavily doped; and heat sinking means thermally coupled to said buffer region, the amount of thermal coupling between said heat sinking means and said buffer region being such that the noise measure of said circuit is less than 50 db.

14. The combination of claim 13 wherein said circuit produces an output power of at least one watt.

15. The combination of claim 14 further comprising: trap sites in said avalanche region for increasing the magnitude of the effective injection current of said diode.

16. The combination of claim 15 wherein said metal contact comprises a metal having a work function lower than the work function of platinum or chromium.

17. A Read-type diode having a noise measure less than 50 db comprising in combination:

a Schottky-barrier forming metal contact;

an avalanche region of semiconductor material adjacent said Schottky-barrier forming metal contact, said avalanche region having a doping density in the range of $5 \times 10^{15}$ to $1 \times 10^{17}/cm^3$;

an avalanche termination region of semiconductor material adjacent said avalanche region, said avalanche termination region having a doping density in the range of $2 \times 10^{17}$ to $5 \times 10^{17}/cm^3$, said avalanche termination region being of sufficient thickness to reduce the electric field within said avalanche termination region below the level sufficient for causing charge carrier multiplication;

a drift region of semiconductor material adjacent said avalanche termination region, said drift region having a doping density in the range of $3 \times 10^{15}$ to $3 \times 10^{16}/cm^3$, the length of said drift region being determined in accordance with a preferred operating frequency of said diode;

wherein said avalanche region comprises a plurality of trap means for increasing the magnitude of the effective injection current of said diode.

18. The combination of claim 17 wherein said trap means comprises lattice discontinuities in said avalanche region.

19. The combination of claim 17 wherein said trap means compromises atoms of doping material in said avalanche region, said doping material being different from the dopant used to dope said avalanche region to said doping density in said range of $5 \times 10^{15}$ to $1 \times 10^{17}/cm^3$.

20. A Read-type diode comprising in combination:

a Schottky-barrier forming metal contact;

a layer of oxide upon at least portions of said metal contact;

an avalanche region of semiconductor material adjacent said layer of oxide, said avalanche region having a doping density in the range of $5 \times 10^{15}$ to $1 \times 10^{17}/cm^3$;

an avalanche termination region of semiconductor material adjacent said avalanche region, said avalanche termination region having a doping density in the range of $2 \times 10^{17}$ to $5 \times 10^{17}/cm^3$, said avalanche termination region being of sufficient thickness to reduce the electric field within said avalanche termination region below the level sufficient for causing charge carrier multiplication; and a drift region of semiconductor material adjacent said avalanche termination region, said drift region having a doping density in the range of $3 \times 10^{15}$ to $3 \times 10^{16}/cm^3$, the length of said drift region being determined in accordance with a preferred operating frequency of said diode.

* * * * *

UNITED STATES PATENT OFFICE
CERTIFICATE OF CORRECTION

Patent No. 4,060,820    Dated November 29, 1977

Inventor(s) Robert A. Pucel and Hermann Statz

It is certified that error appears in the above-identified patent and that said Letters Patent are hereby corrected as shown below:

In the Specification

Column 9, line 17, change "$\alpha 0$" to $-\alpha-$;
Column 9, line 19, change "$\epsilon 0$" to $-\epsilon-$;
Column 15, line 1, change equation (5.15) to $$- \quad i_{ca}(1) = g_{11}v_a(1) + \overline{g_{11}}v_a^*(1) + g_{10}v_a(0) + H(1,t_o) \quad -;$$

Column 15, line 67 should read as follows, $$- \quad \overline{i_e(1,t_o)i_e^*(1,t_o)}, \overline{i_e(1,t_o)i_e(1,t_o)} \text{ and the complex conjugate} \quad -;$$

Column 16, line 15 should be deleted;
Column 16, line 23, change "$i_e(1,t_o)e_e^*(1,t_o)$" to $$- \quad \overline{i_e(1,t_o)i_e^*(1,t_o)} \quad -;$$

Column 16, line 57, change "$S(m)$" to $-\overline{S}(m)-$;
Column 16, line 60, change "$i_e(1)i_e^*(1)$ and $i_e(1)i_e(1)$" to $$- \quad \overline{i_e(1)i_e^*(1)} \text{ and } \overline{i_e(1)i_e(1)} \quad -;$$

UNITED STATES PATENT OFFICE
CERTIFICATE OF CORRECTION

Patent No. 4,060,820        Dated November 29, 1977

Inventor(s) Robert A. Pucel and Hermann Statz

It is certified that error appears in the above-identified patent and that said Letters Patent are hereby corrected as shown below:

In the Specification

Column 18, line 25 should read - $\omega_o t \, [Ni_e(1, t_o) + \text{complex conjugate}] + j \sin \omega_o t \, [\bar{N}$ - ;

Column 18, equation (6.4) should read

- $\bar{N} = Q \exp - j\phi - p \exp j\phi.$ -;

Column 20, line 26, change "S(n)" to - $\bar{S}(n)$ -;

Signed and Sealed this

Second Day of May 1978

[SEAL]

Attest:

RUTH C. MASON
Attesting Officer

LUTRELLE F. PARKER
Acting Commissioner of Patents and Trademarks